US012717363B2

(12) United States Patent
Lanka et al.

(10) Patent No.: US 12,717,363 B2
(45) Date of Patent: Aug. 25, 2026

(54) POWER SUPPLY CIRCUIT WITH IMPROVED POWER EFFICIENCY USING MULTIPLEXERS

(71) Applicant: QUALCOMM Incorporated, San Diego, CA (US)

(72) Inventors: Subbarao Lanka, Bangalore (IN); Shruti Hanumanthaiah, Bangalore (IN); Chethan Devaraj, Bangalore (IN)

(73) Assignee: QUALCOMM Incorporated, San Diego, CA (US)

(*) Notice: Subject to any disclaimer, the term of this patent is extended or adjusted under 35 U.S.C. 154(b) by 104 days.

(21) Appl. No.: 18/753,838

(22) Filed: Jun. 25, 2024

(65) Prior Publication Data

US 2025/0390124 A1 Dec. 25, 2025

(51) Int. Cl.
*G06F 1/00* (2006.01)
*G05F 1/46* (2006.01)
*H03K 17/00* (2006.01)

(52) U.S. Cl.
CPC ............. *G05F 1/46* (2013.01); *H03K 17/002* (2013.01)

(58) Field of Classification Search
CPC ................................ G05F 1/46; H03K 17/002
See application file for complete search history.

(56) References Cited

U.S. PATENT DOCUMENTS 8,004,111 B2 * 8/2011 Potter ....................... G06F 1/26 307/18
9,941,880 B1 * 4/2018 Lesea ................... H03K 19/003
10,672,464 B2 * 6/2020 Jeng ..................... G11C 11/1657
2010/0225167 A1 * 9/2010 Stair .......................... H02J 3/14 307/29
2014/0375383 A1 * 12/2014 Silver ................... H02M 3/156 330/127
2017/0005574 A1 1/2017 Wyland
2017/0060224 A1 3/2017 Cao et al.
2017/0277238 A1 * 9/2017 Park ......................... G06F 1/266
2017/0371362 A1 * 12/2017 Fernald .............. G01R 19/0092
2018/0284859 A1 10/2018 Pant et al.
2019/0346908 A1 11/2019 Srinivas et al.
2020/0259496 A1 * 8/2020 Ferriss .................... H03L 7/099
2020/0313539 A1 10/2020 Hall et al.
2022/0004249 A1 1/2022 Han (Continued)

OTHER PUBLICATIONS

International Search Report and Written Opinion PCT/US2025/033490 ISA/EPO Oct. 6, 2025.

*Primary Examiner* — Xuxing Chen
(74) *Attorney, Agent, or Firm* — Patterson + Sheridan, L.L.P.

(57) ABSTRACT

Certain aspects of the present disclosure are directed towards methods and apparatus for power generation. An example method generally includes: determining at least one multiplexer configuration of one or more multiplexers to direct current from at least one of a plurality of power supply phase circuits to at least one of a plurality of voltage rails, wherein a first operating region of each of the plurality of power supply phase circuits is identified based on a power efficiency of each of the plurality of power supply phase circuits, and wherein the at least one multiplexer configuration is determined based on the first operating region; and controlling the one or more multiplexers based on the at least one multiplexer configuration.

33 Claims, 9 Drawing Sheets

(56) References Cited

U.S. PATENT DOCUMENTS

| | | | | |
|---|---|---|---|---|
| 2022/0376515 | A1 | 11/2022 | Singh et al. | |
| 2023/0026653 | A1* | 1/2023 | Lambert | G06F 13/20 |
| 2024/0183884 | A1* | 6/2024 | Thigle | G01R 19/0038 |
| 2024/0429908 | A1* | 12/2024 | Pant | H03K 17/002 |
| 2025/0202469 | A1* | 6/2025 | Ipek | H02J 50/00 |

* cited by examiner

900

| Voltage Rail | Before Reconfiguration | | | After Reconfiguration | | |
|---|---|---|---|---|---|---|
| | Buck Phases | High Efficiency Range (mA) | Current Consumption (mA) | Buck Phases | High Efficiency Range (mA) | Current Consumption (mA) |
| Load 1 | 1(S1) | 30-1000 | 1047 | 1(S1) | 30-1000 | 1047 |
| Load 2 | 3(S2-S4) | 90-3000 | 1632 | 2(S2-S3) | 60-2000 | 1632 |
| Load 3 | 1(S5) | 30-1000 | 288 | 1(S5) | 30-1000 | 288 |
| Load 4 | 1(S6) | 30-1000 | 474 | 1(S6) | 30-1000 | 474 |
| Load 5 | 2(S7-S8) | 60-2000 | 2200 | 2(S7-S8) | 60-2000 | 2200 |
| Load 6 | 2(S9-S10) | 60-2000 | 3347 | 3(S9-S10-S4) | 90-3000 | 3347 |
| Load 7 | 1(S11) | 30-1000 | 641 | 1(S11) | 30-1000 | 641 |
| Load 8 | 1(S12) | 30-1000 | 1202 | 2(S12-S13) | 60-2000 | 2000 |
| Load 9 | 1(S13) | 30-1000 | 798 | | | |
| Load 10 | 3(S14-S16) | 90-3000 | 1612 | 3(S14-S16) | 90-3000 | 2398 |
| Load 11 | 1(S17) | 30-1000 | 748 | 1(S17) | 30-1000 | 748 |
| Load 12 | 4(S18-S21) | 120-4000 | 4090 | 4(S18-S21) | 120-4000 | 4090 |
| Load 13 | 1(S22) | 30-1000 | 786 | | | |
| Load 14 | 1(S23) | 30-1000 | 1768 | 2(S22-S23) | 60-2000 | 1768 |

POWER SUPPLY CIRCUIT WITH IMPROVED POWER EFFICIENCY USING MULTIPLEXERS

TECHNICAL FIELD

Certain aspects of the present disclosure generally relate to electronic circuits and, more particularly, to techniques for supplying power and power supply circuitry.

BACKGROUND

Power management integrated circuits (power management ICs or PMICs) are used to manage the power scheme of a host system and may include and/or control one or more voltage regulators. A PMIC may be used in battery-operated devices, such as mobile phones, tablets, laptops, wearables, etc., to control the flow and direction of electrical power in the devices. The PMIC may perform a variety of functions for the device, such as DC-to-DC conversion (e.g., using a voltage regulator as described above), battery charging, power-source selection, voltage scaling, power sequencing, etc.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure are directed towards an electronic device. The electronic device generally includes: a plurality of power supply phase circuits; a voltage rail; a first multiplexer coupled between at least one of the plurality of power supply phase circuits and the voltage rail; and a controller configured to: determine a multiplexer configuration of the first multiplexer to direct current from the at least one of the plurality of power supply phase circuits to the voltage rail, wherein a first operating region of each of the plurality of power supply phase circuits is identified based on a power characteristic of each of the plurality of power supply phase circuits, and wherein the controller is configured to identify the multiplexer configuration based on the first operating region; and control the first multiplexer based on the multiplexer configuration.

Certain aspects of the present disclosure are directed towards a method for power generation. The method generally includes: determining at least one multiplexer configuration of one or more multiplexers to direct current from at least one of a plurality of power supply phase circuits to at least one of a plurality of voltage rails, wherein a first operating region of each of the plurality of power supply phase circuits is identified based on a power efficiency of each of the plurality of power supply phase circuits, and wherein the at least one multiplexer configuration is determined based on the first operating region; and controlling the one or more multiplexers based on the at least one multiplexer configuration.

Certain aspects of the present disclosure are directed towards a non-transitory computer-readable medium having instructions stored thereon, that when executed by one or more processors, cause the one or more processors to: determine at least one multiplexer configuration of one or more multiplexers to direct current from at least one of a plurality of power supply phase circuits to at least one of a plurality of voltage rails, wherein an operating region of each of the plurality of power supply phase circuits is identified based on a power efficiency of each of the plurality of power supply phase circuits, and wherein the at least one multiplexer configuration is determined based on the operating region; and control the one or more multiplexers based on the at least one multiplexer configuration.

Certain aspects of the present disclosure are directed towards an apparatus for power generation. The apparatus generally includes a plurality of power supply phase circuits, a plurality of voltage rails, and one or more multiplexers coupled between one or more of the plurality of power supply phase circuits and one or more of the plurality of voltage rails, the one or more multiplexers including at least one of: a first multiplexer having inputs coupled to outputs of at least a first phase circuit and a second phase circuit of the plurality of power supply phase circuits and an output coupled to a first voltage rail of the plurality of voltage rails; or a second multiplexer having a first input coupled to an output of the first multiplexer, a second input coupled to the output of the second phase circuit, and an output coupled to a second voltage rail of the plurality of voltage rails.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
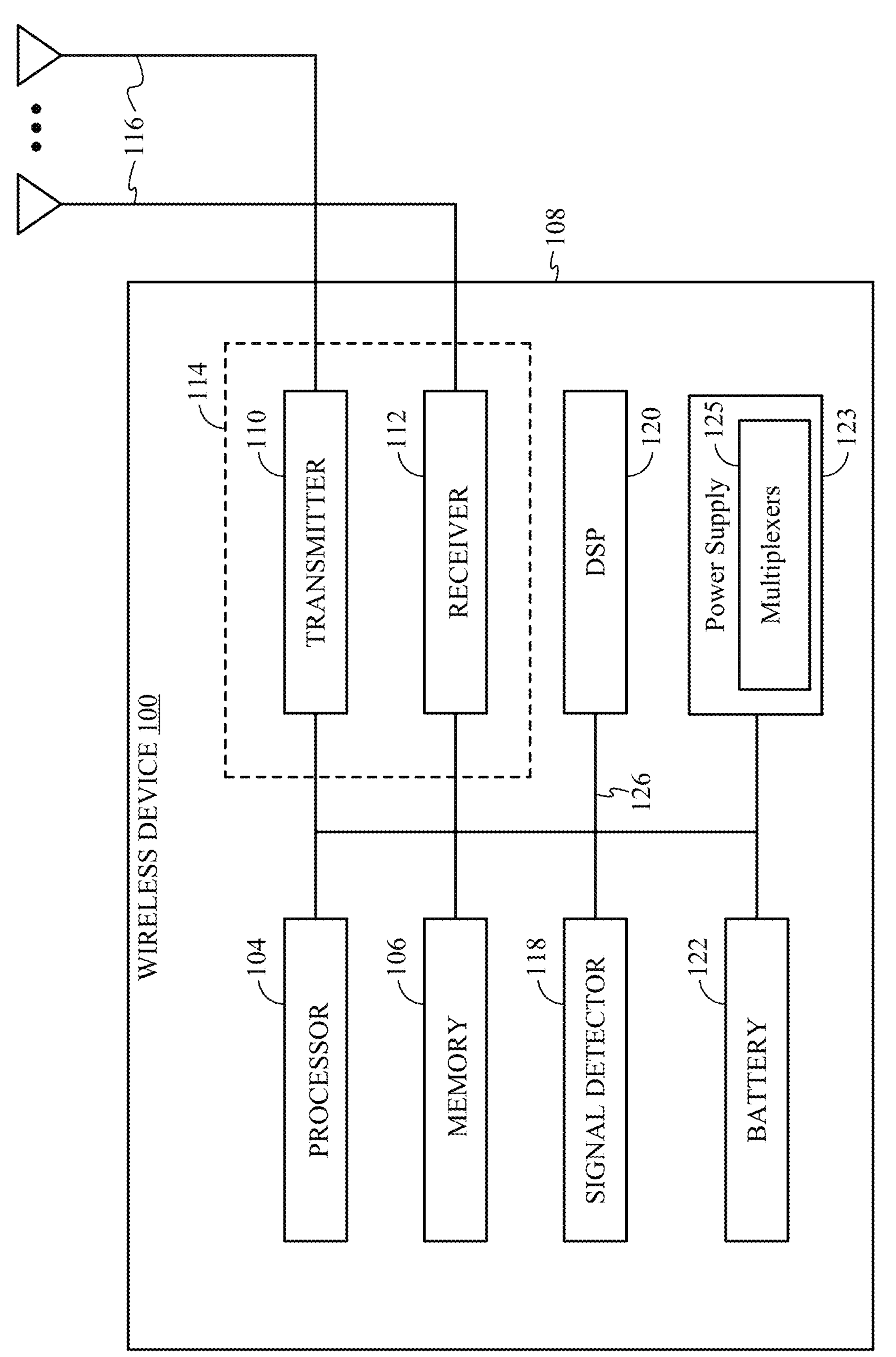
FIG. 1 illustrates a block diagram of an example device that includes a power supply system, in which aspects of the present disclosure may be practiced.

Certain aspects of the present disclosure are directed towards power supply circuitry to dynamically gang power supply phases and/or merge voltage rails to improve power supply efficiency. As used herein, a power supply phase (e.g., also referred to as a "phase" or a "phase circuit") generally refers to an SMPS circuit, which may include switches for controlling current flow across an inductive element. The power supply circuitry may be implemented with one or more power multiplexers to dynamically gang power supply phases to supply current to the same load and/or merge voltage rails to receive power from the same power supply phase. As used herein, merging voltage rails generally refers to electrically coupling the voltage rails to the same node so that current can be directed to the merged voltage rails. Ganging or merging power supply phases generally refers to aggregating multiple phases and directing current to the same one or more voltage rails. The ganging of the power supply phases and/or merging of voltage rails may be performed in an attempt to operate the power supply phases within a high-efficiency operating region. For example, each power supply phase may operate more efficiently when supplying between 30 mA and 1000 mA compared to when the power supply phase is supplying less than 30 mA or more than 1000 mA. While 30 mA and 1000 mA are provided as example current thresholds to facilitate understanding, any current thresholds may be possible for different types of power supplies. An operating region may refer to a power supply operating within a range of output currents. In some cases, a machine learning (ML) component may be trained to control the power multiplexers so that the power supply phases operate with high efficiency, as described in more detail herein.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Device

It should be understood that aspects of the present disclosure may be used in a variety of applications. Although the present disclosure is not limited in this respect, the circuits disclosed herein may be used in any of various suitable apparatuses, such as in the power supply, battery charging circuit, or power management circuit of a communication system, a video codec, audio equipment such as music players and microphones, a television, camera equipment, and test equipment such as an oscilloscope.

FIG. 1 illustrates an example device 100 in which aspects of the present disclosure may be implemented. The device 100 may be a battery-operated device such as a cellular phone, a personal digital assistant (PDA), a handheld device, a wireless device, a laptop computer, a tablet, a smartphone, an Internet of things (IoT) device, a wearable device, a virtual reality (VR) or augmented reality (AR) device, etc.

The device 100 may include a processor 104 that controls operation of the device 100. The processor 104 may also be referred to as a central processing unit (CPU). Memory 106 provides instructions and data to the processor 104. The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise coupled to the housing 108 and electrically connected to the transceiver 114.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122, which may be used to power the various components of the device 100 (e.g., when the device is disconnected from an external power source). The device 100 may also include a power supply system 123 for managing the power from the battery (or from one or more power ports for receiving external power) to the various components of the device 100. At least a portion of the power supply system 123 may be implemented in one or more power management integrated circuits (power management ICs or PMICs). The power supply system 123 may perform a variety of functions for the device 100 such as DC-to-DC conversion, battery charging, power-source selection, voltage scaling, power sequencing, etc. For example, the power supply system 123 may include one or more power supply circuits, which may include a switched-mode power supply circuit. The switched-mode power supply circuit may be implemented by any of various suitable switched-mode power supply circuit topologies, such as a three-level buck converter, a divide-by-two (Div2) charge pump, or an adaptive combination power supply circuit, which can switch between operating in a three-level buck converter mode and a two-level buck converter mode. In some aspects, the power supply system 123 may include one or more power multiplexers 125 for dynamically ganging power supply phases and/or merging voltage rails to improve power supply efficiency, as described in more detail herein.

The various components of the device 100 may be coupled together by a bus system 126, which may include a power bus, a control signal bus, and/or a status signal bus in addition to a data bus. Additionally or alternatively, various combinations of the components of the device 100 may be coupled together by one or more other suitable techniques.

Example Power Supply Circuitry and Distribution

Extended reality (XR) devices generally refer to virtual reality (VR) devices, augmented reality (AR) devices, and mixed reality (MR) devices. Different types of XR devices may have different levels of thermal design power (TDP). For instance, in some cases, a VR device may have a higher TDP than an AR device. Some XR devices may be heavy and bulky in form factor due to compute-intensive and immersive use cases, resulting in a large number of electronics. To achieve a sleek form factor and weight reduction for XR devices, TDP should be reduced, and power efficiency should be increased. Due to compute-intensive use cases, the average currents consumed by voltage rails for some XR devices are in the range of several amperes. This high load current may lead to low power management integrated circuit (PMIC) battery-to-load efficiency. While VR, AR, and MR are referred to herein as example use cases with varying levels of current consumption to facilitate understanding, certain aspects of the present disclosure may be implemented with any suitable use cases.

Figure 2:
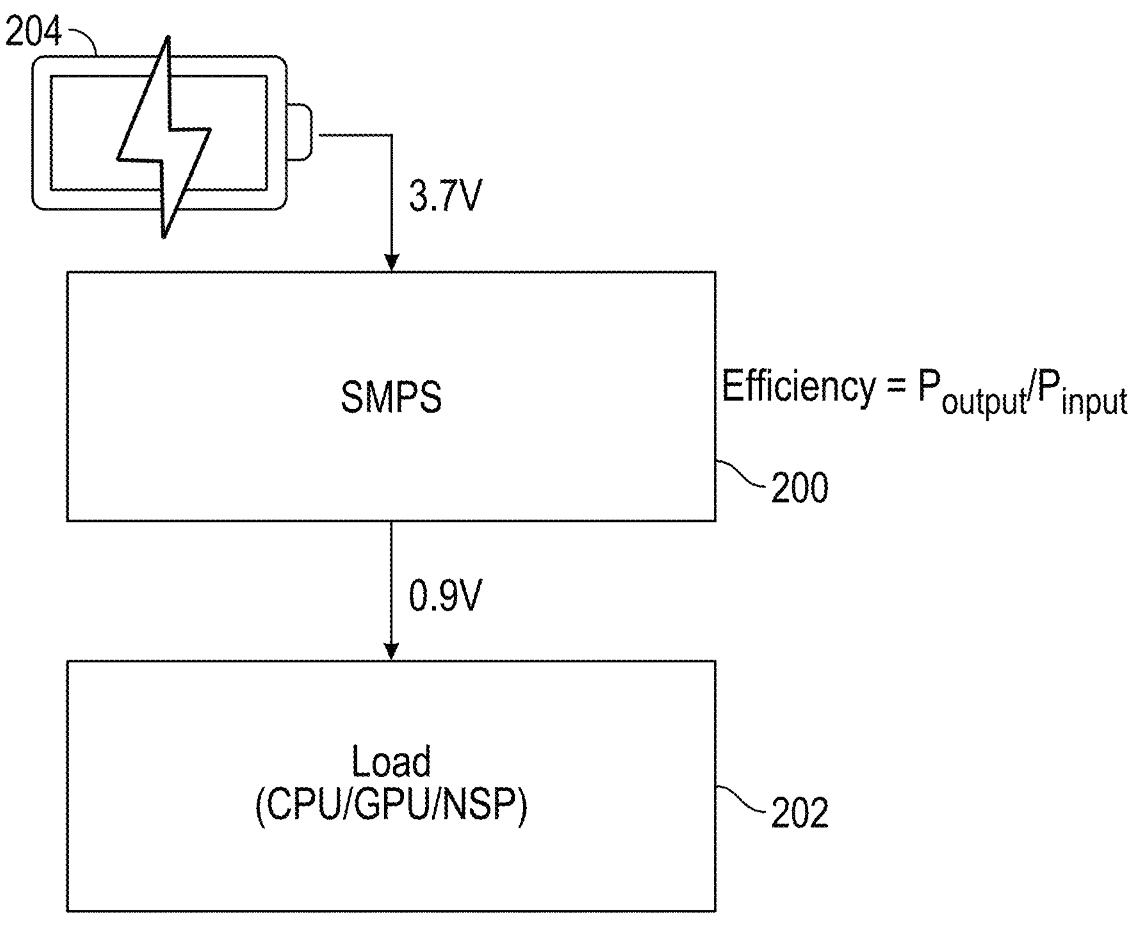
FIG. 2 is a block diagram of a switched-mode power supply (SMPS) regulating a voltage to be provided to a load.

FIG. 2 is a block diagram of a switched-mode power supply (SMPS) 200 regulating a voltage to be provided to a load 202. A PMIC may include at least one switched-mode power supply (SMPS) with one or more phases. As shown, the SMPS 200 may receive an input supply (e.g., 3.7 V DC signal) from a battery 204 and generate a regulated output voltage (e.g., down to 0.9 V DC) at a voltage rail for the load 202. The load 202 may include any circuit or processing unit of an electronic device, such as an XR device. For example, the load 202 may include a central processing unit (CPU), a graphical processing unit (GPU), or a neural signal processor (NSP), as shown. However, the aspects described herein may be applied to any of various other suitable loads. The SMPS may be any suitable regulator, such as a buck converter. A buck converter (also referred to as a "step-down converter") is a DC-to-DC converter that receives an input voltage and generates an output voltage that less than the input voltage. The power efficiency (n) of the SMPS may be equal to the output power ($P_{output}$) divided by the input power $P_{input}$ of the SMPS.

Figure 3:
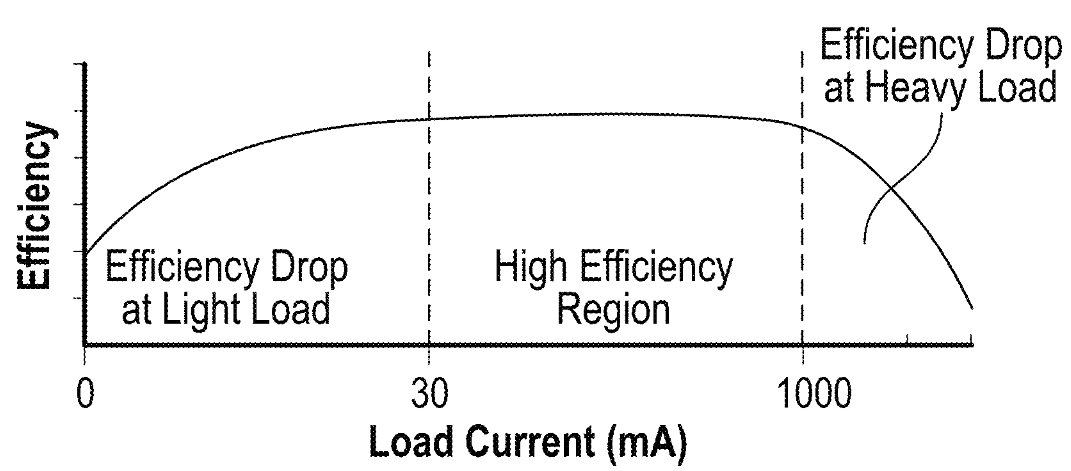
FIG. 3 is a graph illustrating example power efficiencies of an SMPS at different levels of current consumption.

FIG. 3 is a graph 300 illustrating example power characteristic of an SMPS at different levels of current consumption. A power characteristic may refer to a power efficiency of the SMPS. For example, an SMPS may have low power efficiency (less than 85%) at low currents (e.g., less than 30 mA per phase) and at high currents (e.g., greater than 1000 mA per phase). High power efficiency may be achieved for current in the range of 30 mA to 1000 mA, which may be referred to herein as a "high-efficiency operating region." The SMPS may have a low power efficiency in an under-load operating region (e.g., where the current output of the SMPS is less than 30 mA per phase, also referred to as a "light load condition") and have a low power efficiency in an over-load operating region (e.g., where the current output of the SMPS is more than 1000 mA per phase, also referred to as a "heavy load condition). Thus, an SMPS may have a region of operation with respect to load current that provides high power efficiency between two low-efficiency operating regions. SMPS power efficiency plays an important role in battery life. An SMPS operating in the high-efficiency operating region consumes less energy to deliver the same output power to the load.

Figure 4:
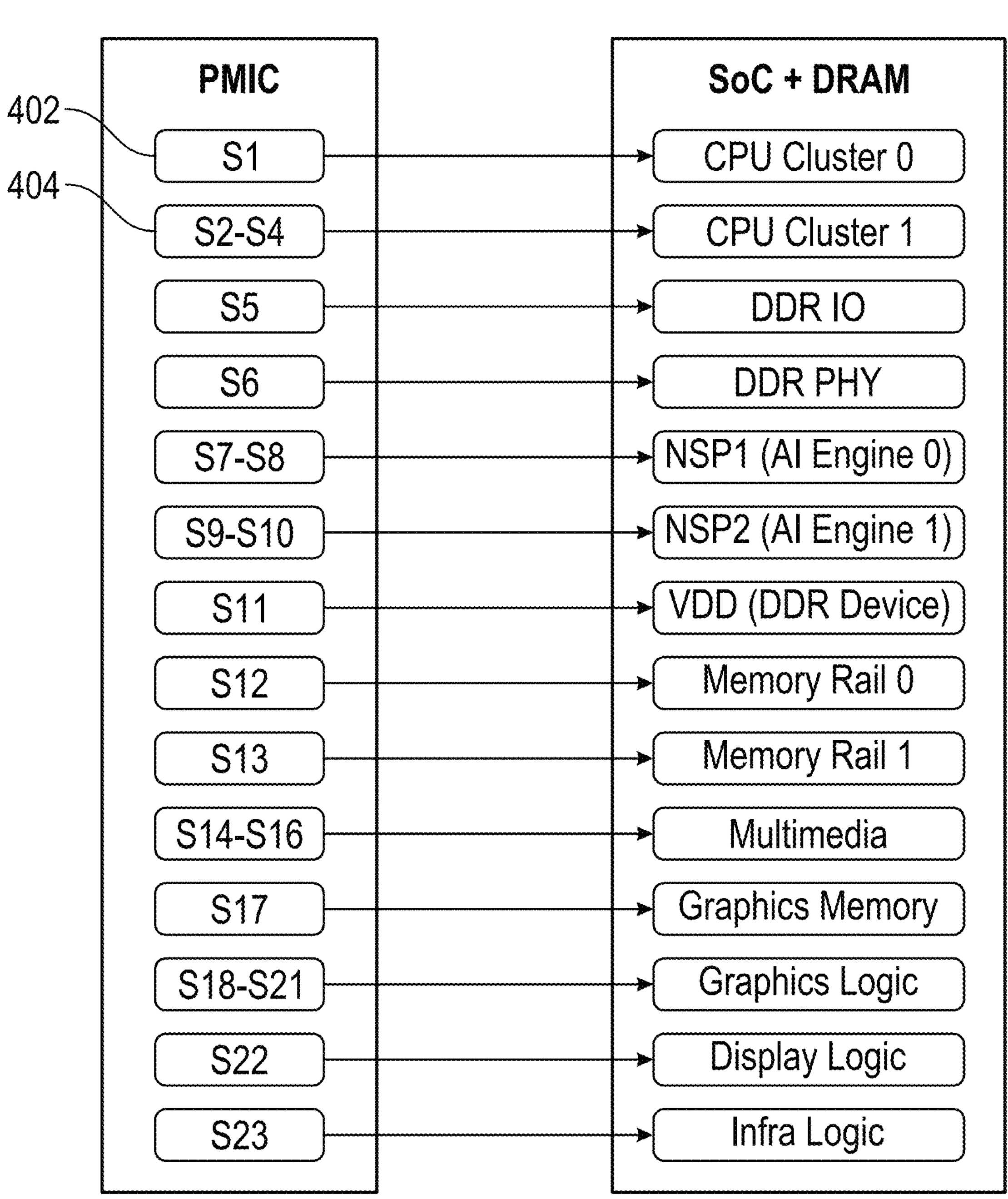
FIG. 4 illustrates a power distribution network including various SMPSs used to power respective loads.

FIG. 4 illustrates a power distribution network 400 including various switched-mode power supplies (SMPSs) used to power respective loads. Multiple SMPS phases are shown, labeled S1 to S23. While 23 phases are shown to facilitate understanding, any number of phases may be used. An SMPS may operate with a single phase (e.g., SMPS 402 may operate with a single SMPS phase S1) or may operate with multiple phases (e.g., SMPS 404 may operate with multiple SMPS phases S2-S4). The SMPSs may be used to power loads of a system on chip (SoC) and dynamic random access memory (DRAM). For example, the loads may include CPU clusters, double data rate (DDR) memory input/output (IO), DDR memory physical (PHY) layer, NSPs, a voltage rail (VDD) for a DDR device, memory power supply rails, multimedia, graphics memory and logic, display logic, and infrastructure (infra or IR) logic. Some loads may be mapped to receive power from a single-phase SMPS, while others may be mapped to receive power from a multi-phase SMPS. For example, a first NSP (labeled "NSP1," including an artificial intelligence (AI) engine) may receive power from a multi-phase SMPS may operate with phases S7-S8. In contrast, the display logic may receive power from a single-phase SMPS may operate with phase S22.

In some use cases (or mode of operation), SMPS power efficiency may be poor due to high and low load conditions as described with respect to FIG. 3. For example, the SMPS phases S7-S8 for NSP1 may be operating in an over-load operating region with low power efficiency, whereas SMPS phase S13 for memory rail 1 may be operating in an under-load operating region with low power efficiency. Adding phases for loads associated with over-load conditions in a static manner may be expensive and increase an electronic device's area consumption. In some cases, the same PMIC may be used for electronic devices aimed at different use cases where, in some low-load-current use cases, loads may have a tendency to operate in the under-load operating region, and in some high-load-current use cases, loads may have a tendency to operate in the over-load operating region.

Certain aspects are directed towards improving a PMIC battery-to-load efficiency for low-load-current use cases and high-load-current use cases. For example, an SMPS may be operated in the high-efficiency operating region by merging loads dynamically in low-load-current use cases (e.g., AR use cases). For example, multiple loads may be dynamically mapped to the same multi-phase or single-phase SMPS so that the SMPS output current per phase increases and is between a low load-current threshold and a high load-current threshold (e.g., in the range of 30 mA to 1000 mA) corresponding to the high-efficiency operating region. Merging loads may be accomplished using switches (e.g., one or more power multiplexers) inside a system-on-chip (SoC).

Certain aspects are directed towards dynamically ganging multiple SMPS phases to supply the same load to improve SMPS power efficiency when the load current is above the high load-current threshold (e.g., greater than 1000 mA). For example, certain aspects dynamically map multiple SMPS phases (e.g., gang multiple SMPS phases) to the same load if the load current per phase is greater than 1000 mA (e.g., is in the over-load operating region as described with respect to FIG. 3). In some implementations, ganging multiple SMPS phases may be accomplished using switches inside the PMIC.

Merging loads statically for the benefit of one use case may adversely impact the power for other use cases that may otherwise benefit from the loads operating at different voltage corners and powered separately. Thus, dynamic merging and separating loads should be carefully considered. Dynamic ganging and unganging should be considered carefully because using an SMPS with a static number of phases may result in increased SMPS current leakage. Moreover, assigning a large number of SMPS phases to a load may increase the area consumption and cost of the device. Thus, certain aspects provide for the dynamic merging of loads within an SoC to improve SMPS power efficiency.

Figure 5A:
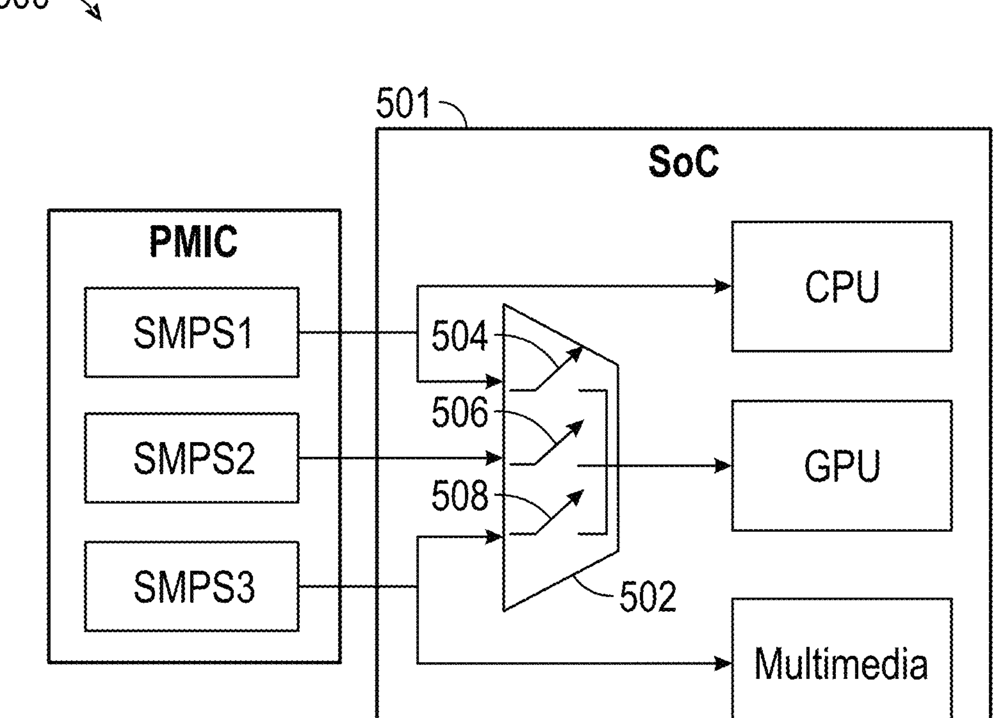
FIG. 5A illustrates a power distribution network including a power multiplexer implemented in a system on chip (SoC) for merging or separating loads, in accordance with certain aspects of the present disclosure.

FIG. 5A illustrates a power distribution network 500 including a power multiplexer implemented in an SoC 501 for merging or separating loads, in accordance with certain aspects of the present disclosure. While the power multiplexer is illustrated in FIG. 5A as being part of the SoC, the power multiplexer may be implemented external to the SoC. Traditionally, each load may have one or more SMPSs to meet peak load current usages. Additional phases may be added statically if a single phase's output power capacity is insufficient for the load. During mission mode for some low-load-current use cases, the current drawn by some loads may be less than 30 mA; hence, some SMPSs may operate in an under-load operating region with low power efficiency.

In certain aspects of the present disclosure, one or more power multiplexers (e.g., switches) may be used to dynamically merge loads if one or more loads consume low current (e.g., less than the low load-current threshold, such as 30 mA, corresponding to the under-load operating region). For example, when the current consumption of a load from an SMPS is less than 30 mA, a power multiplexer 502 in the SoC may be used to switch the load to receive power from another SMPS that is operating in a high-efficiency region or another SMPS that is operating in the under-load operating region that can be switched to operating in the high-efficiency region by merging loads. For example, assume the CPU load consumes 80 mA from SMPS1 (e.g., a single-phase SMPS) and the GPU load consumes 20 mA from SMPS2 (e.g., a single-phase SMPS). Thus, SMPS2 may be operating in the under-load operating region with low power efficiency. The multiplexer 502 may merge the CPU load and the GPU load to consume power from SMPS1 and turn off SMPS2. Thus, SMPS1 may operate with a 100 mA output current to the CPU and GPU loads, which is still within the high-efficiency operating region. For instance, the multiplexer 502 may include switches 504, 506, 508 coupled between the GPU load and the respective SMPSs (SMPS1, SMPS2, and SMPS3). To merge the GPU load and the CPU load to consume power from SMPS1, the switch 504 may be closed and switches 506, 508 may be opened. By using the power multiplexer 502 in the SoC, power can be delivered to each load with high power efficiency, thereby saving power.

When the load current being supplied by an SMPS is high (e.g., greater than the high load-current threshold, such as 1000 mA, for a single-phase SMPS) and the SMPS is operating in the over-load operating region, multiple switches of the multiplexer 502 may be closed to draw power from multiple SMPSs, thereby enabling each SMPS to operate in the high-efficiency operating region per phase. For example, assume switch 506 is closed, switches 504, 508 are open, and the GPU load consumes 1200 mA of current from SMPS2. Thus, SMPS2 is operating in the over-load operating region. In this case, both switches 504, 506 may be closed so that SMPS1 and SMPS2 supply the current for the GPU load and both SMPS1 and SMPS2 are operating in the high-efficiency operating region.

Figure 5B:
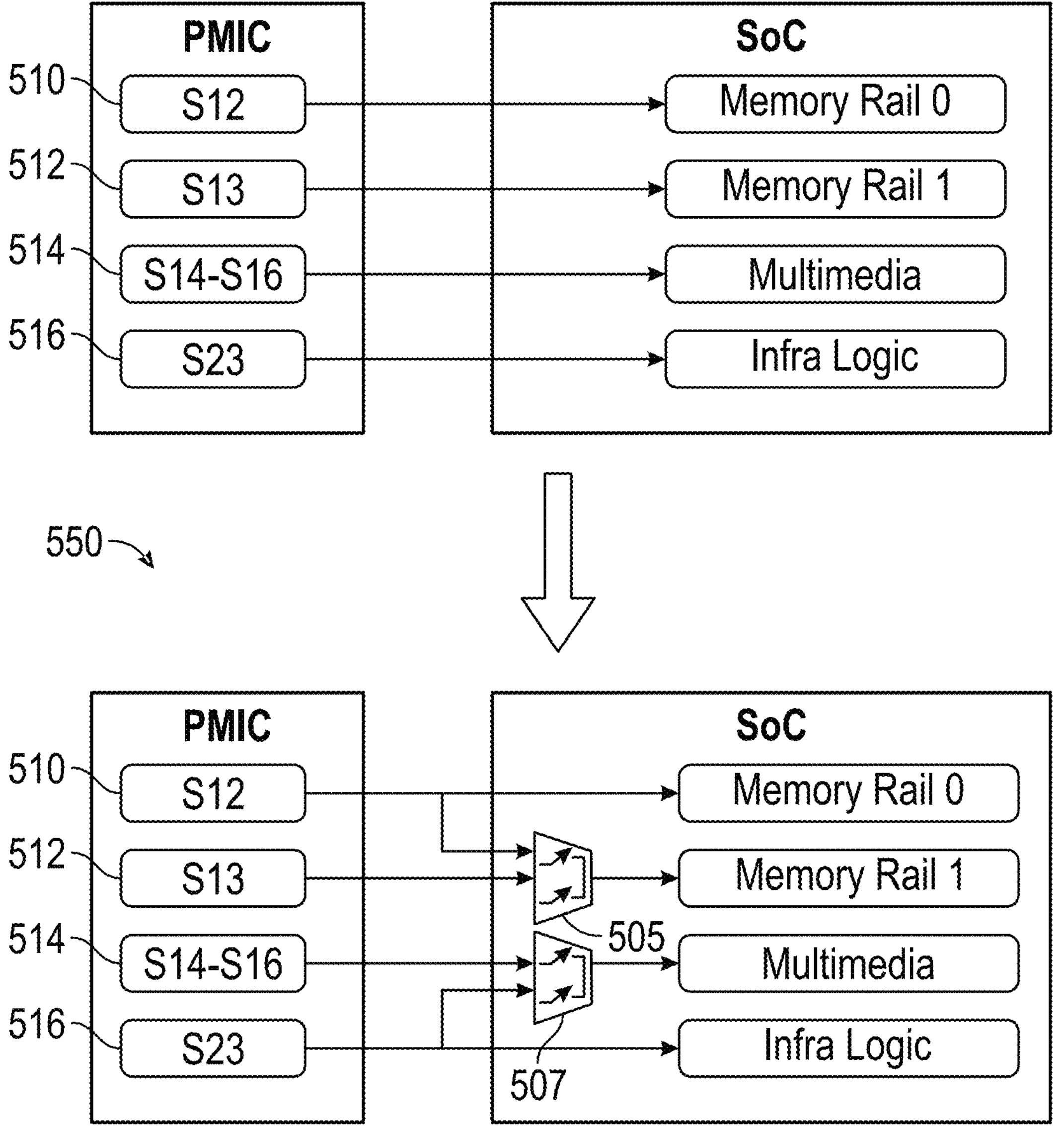
FIG. 5B illustrates a power distribution network including power multiplexers implemented in an SoC for merging or separating loads, in accordance with certain aspects of the present disclosure.

FIG. 5B illustrates a power distribution network 550 including power multiplexers implemented in an SoC for merging or separating loads, in accordance with certain aspects of the present disclosure. In some cases, SMPSs 510, 512, 514, 516 may be configured to provide power for a respective load (e.g., load for memory rail 0, load for memory rail 1, load for multimedia, and load for SoC infrastructure (infra) logic). The SMPS 510 may operate with a single phase S12, SMPS 512 may operate with a single phase S13, SMPS 514 may include multiple phases S14-S16, and SMPS 516 may operate with a single phase S23. In some aspects of the present disclosure, the SoC may be implemented with power multiplexers 505, 507, allowing for the merging or separating of the loads. For example, multiplexer 505 may be controlled to merge loads for memory rails 0 and 1 so that the memory rails 0 and 1 can receive power from the same SMPS 510. Assume that memory rail 0 consumes 216 mA of current and memory rail 1 consumes 24 mA of current. If memory rail 1 is powered by SMPS 512 alone, then SMPS 512 may be operating in an under-load operating region with low power efficiency. However, by merging loads for the memory rails 0 and 1 to be powered by the SMPS 510, SMPS 512 may be turned off, and SMPS 510 may operate in the high-efficiency operating region. Similarly, multiplexer 507 may be used to merge loads for multimedia and infra logic so that the loads can be powered by the same SMPS 516. Any number of loads may be merged. For example, at least two loads may be merged to receive power from the same one or more one or more power supply phases.

Figure 6:
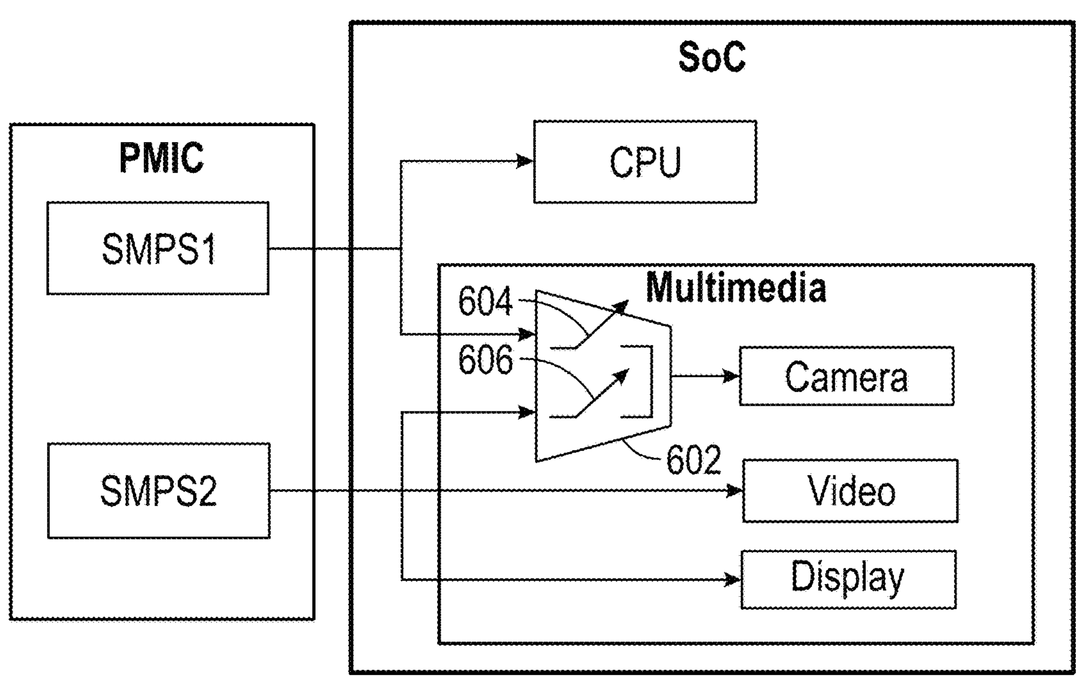
FIG. 6 illustrates a power distribution network including a power multiplexer for dynamic merging of partial loads, in accordance with certain aspects of the present disclosure.

FIG. 6 illustrates a power distribution network 600 including a power multiplexer for dynamic merging of partial loads (e.g., merging of loads within an SoC core), in accordance with certain aspects of the present disclosure. For example, the power multiplexer 602 may be implemented as part of the multimedia core of the SoC as shown in FIG. 6. The multimedia core may include camera circuitry, video circuitry, and display circuitry. The multiplexer 602 may enable the usage of multiple power sources (e.g., SMPSs) for a partial load (e.g., camera circuitry that is part of the multimedia core load). For instance, if the multimedia rail current consumption from SMPS2 exceeds a high load-current threshold (e.g., 1000 mA) so that SMPS2 is operating in the over-load operating region with low power efficiency, a portion of the multimedia load (e.g., referred to as a partial load) may be switched to receive power from a different SMPS. For instance, assume the multimedia core is consuming 1100 mA from SMPS2 with 200 mA of the multimedia core current consumption being for the camera circuitry. The CPU core may be consuming 500 mA from SMPS1. In this case, the multiplexer 602 may be controlled (e.g., closing switch 604 and opening switch 606) so that only the camera circuitry receives power from SMPS1 instead of SMPS2, while the video and display circuitry continue to receive power from SMPS2. In this manner, SMPS1 may be supplying 700 mA, SMPS2 may be supplying 900 mA, and both SMPS1 and SMPS2 operate in the high-efficiency operating region.

Figure 7:
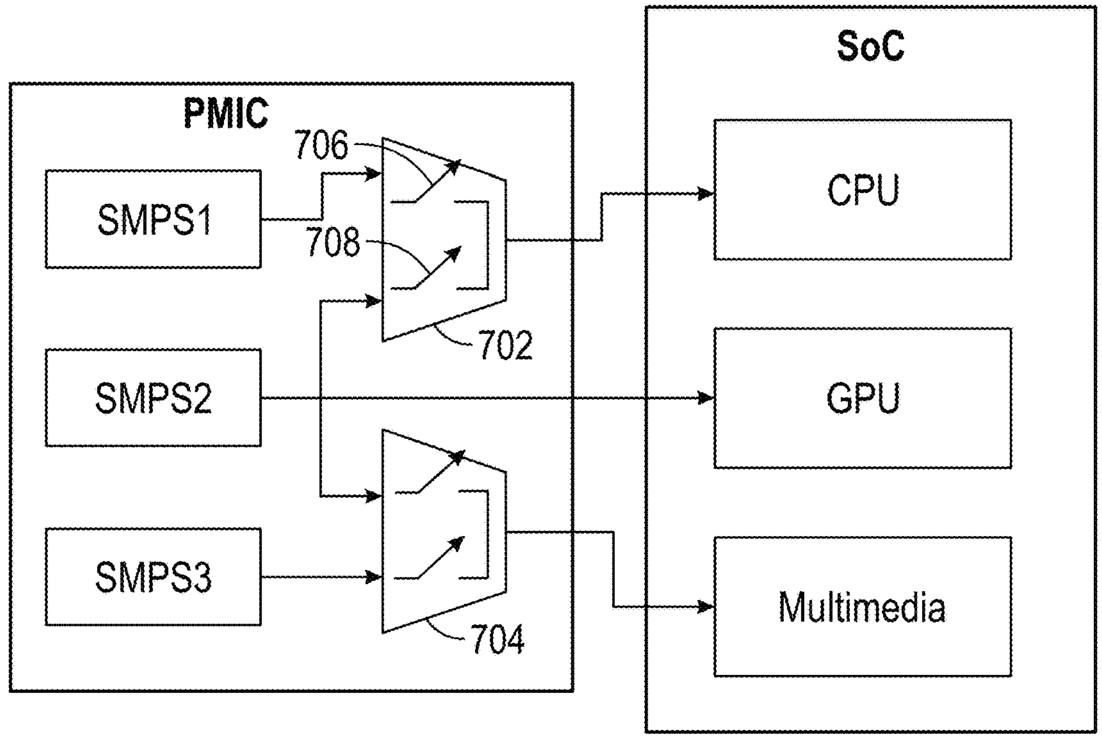
FIG. 7 illustrates a power distribution network with power multiplexers implemented as part of a power management integrated circuit (PMIC), in accordance with certain aspects of the present disclosure.

FIG. 7 illustrates a power distribution network 700 including power multiplexers 702, 704 implemented as part of a PMIC, in accordance with certain aspects of the present disclosure. As described, when the total load current drawn from an SMPS phase exceeds a high load-current threshold (e.g., 1000 mA), the SMPS phase may operate in a less efficient region. In this case, another SMPS may be available on the PMIC that may be ganged with the SMPS using a power multiplexer (e.g., multiplexer 702 or multiplexer 704) on the PMIC. The ganged SMPSs may supply the load current while operating each SMPS phase in the high-efficiency region. Once the load current reduces below the high load-current threshold, the SMPS phases may be unganged. In some cases, if after unganging, one of the SMPS phases is not being used to supply current to any load, the SMPS phase may be turned off to save power (e.g., reduce quiescent power of the SMPS phase). For example, assume that SMPS1 supplies 1100 mA of current to the CPU and that SMPS2 supplies 300 mA of current to the GPU. The multiplexer 702 may be controlled (e.g., closing switching 706, 708) so that the SMPS1 and SMP2 are ganged and together supply the power for the CPU while operating in the high-efficiency region. While FIG. 7 shows the power multiplexers 702, 704 implemented inside the PMIC, some or all the power multiplexers for ganging SMPSs may be implemented external to the PMIC (and external to the SoC).

Figure 8:
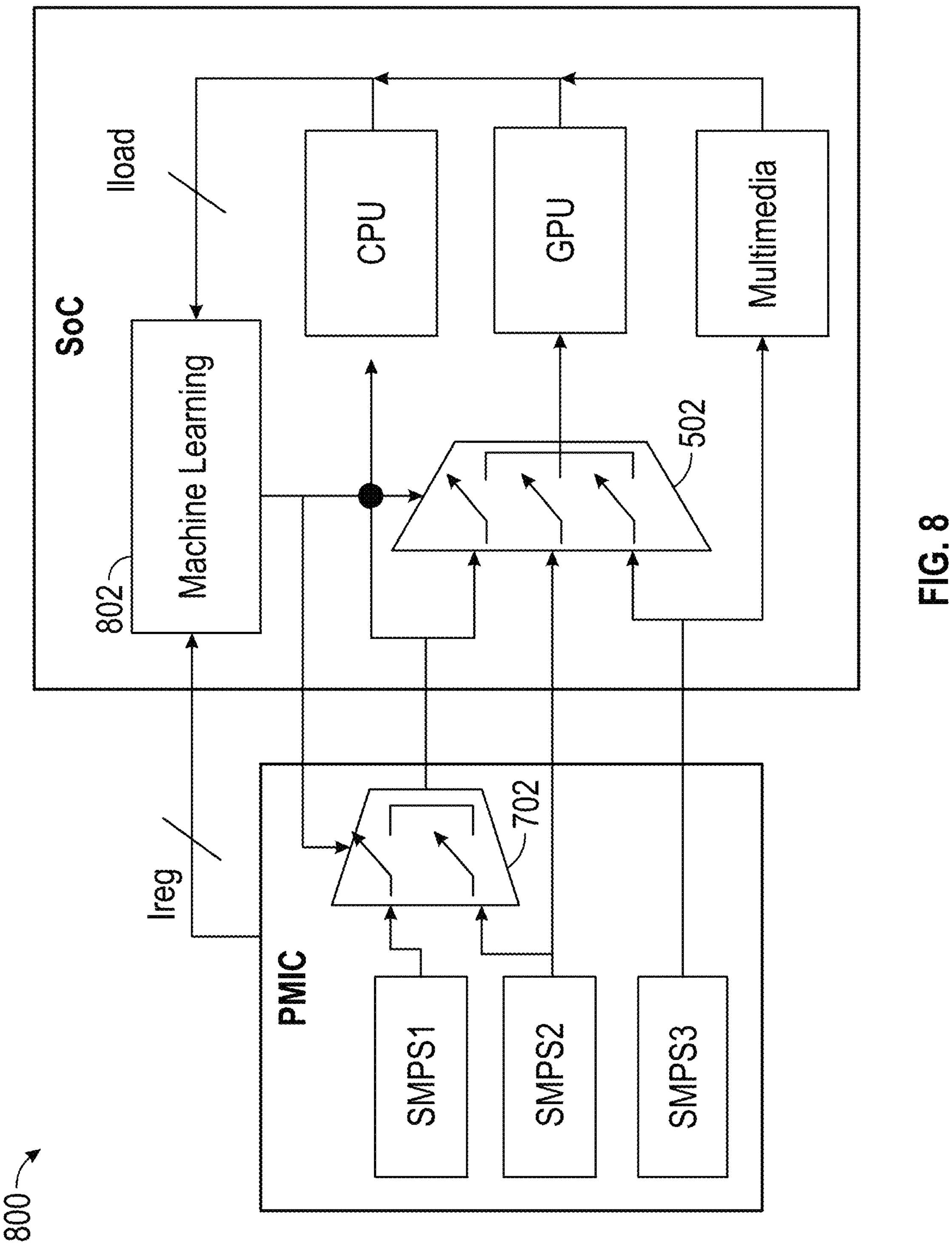
FIG. 8 illustrates a machine learning (ML) component used to control power multiplexers for ganging SMPSs and merging loads, in accordance with certain aspects of the present disclosure.

FIG. 8 illustrates a power distribution network 800 including a machine learning (ML) controller 802 used to control power multiplexers for ganging SMPSs and merging loads, in accordance with certain aspects of the present disclosure. As shown, a power multiplexer 502 may be implemented as part of the SoC for merging and separating loads as described herein. Moreover, as described herein, a power multiplexer 702 may be implemented as part of the PMIC for ganging and unganging SMPSs.

Controlling switches to supply power to loads dynamically may be complex. Power management may involve computing use case power and core current contributions, identifying whether to perform load merging or splitting for high SMPS power efficiency, and identifying switch configurations in PMIC or SoC or a combination of PMIC and SoC. Different use cases and process, voltage, and temperature (PVT) conditions make the dynamic control of ganging and merging of loads more complex. Certain aspects use a trained ML model implemented on a ML component (e.g., the ML controller 802) to control the power multiplexers for ganging SMPSs and merging loads. Depending on the load current drawn by a specific voltage rail or load, the ML component may determine whether to close one or more switches of the power multiplexers to gang PMICs and/or merge loads.

The ML component may receive various input signals. For example, the ML component may receive an indication of a part type of the SoC (e.g., a process corner such as a fast-fast (FF) corner or slow-slow (SS) corner associated with the SoC). The ML component may receive an indication of the voltage to be supplied to each load (e.g., CPU or GPU). The ML component may also receive temperature and frequency specifications of the loads. The ML component may receive a current rating (Irated) of each SMPS phase. For example, a multi-phase SMPS may have a higher output current capability than a single-phase SMPS. The ML component may also receive an indication of the actual current (e.g., regulator current labeled "Ireg") being supplied by each SMPS during operation. The ML component may also receive an indication of the current range associated with the high-efficiency region for each SMPS. The ML component may also receive the current draw (labeled "Iload") of each load, as shown. The ML component may be trained to control the multiplexer configurations based on a specific use case (e.g., a high-power use case or a low-power use case), and in some cases, further based on the inputs to the ML component described herein. In other words, in some implementations, real-time measurements (e.g., SMPS output current and load current measurements) may be provided to the ML component to control the switch configurations of power multiplexers. In some implementations, the output current of SMPSs and load currents may be characterized in a lab using device testing and/or simulations for different use cases. In this case, the ML component may control the switch configurations of the power multiplexers based on an indication of an active use case. The ML component may output multiplexer-select signals to control the power multiplexers of the SoC and/or PMIC.

Figure 9:
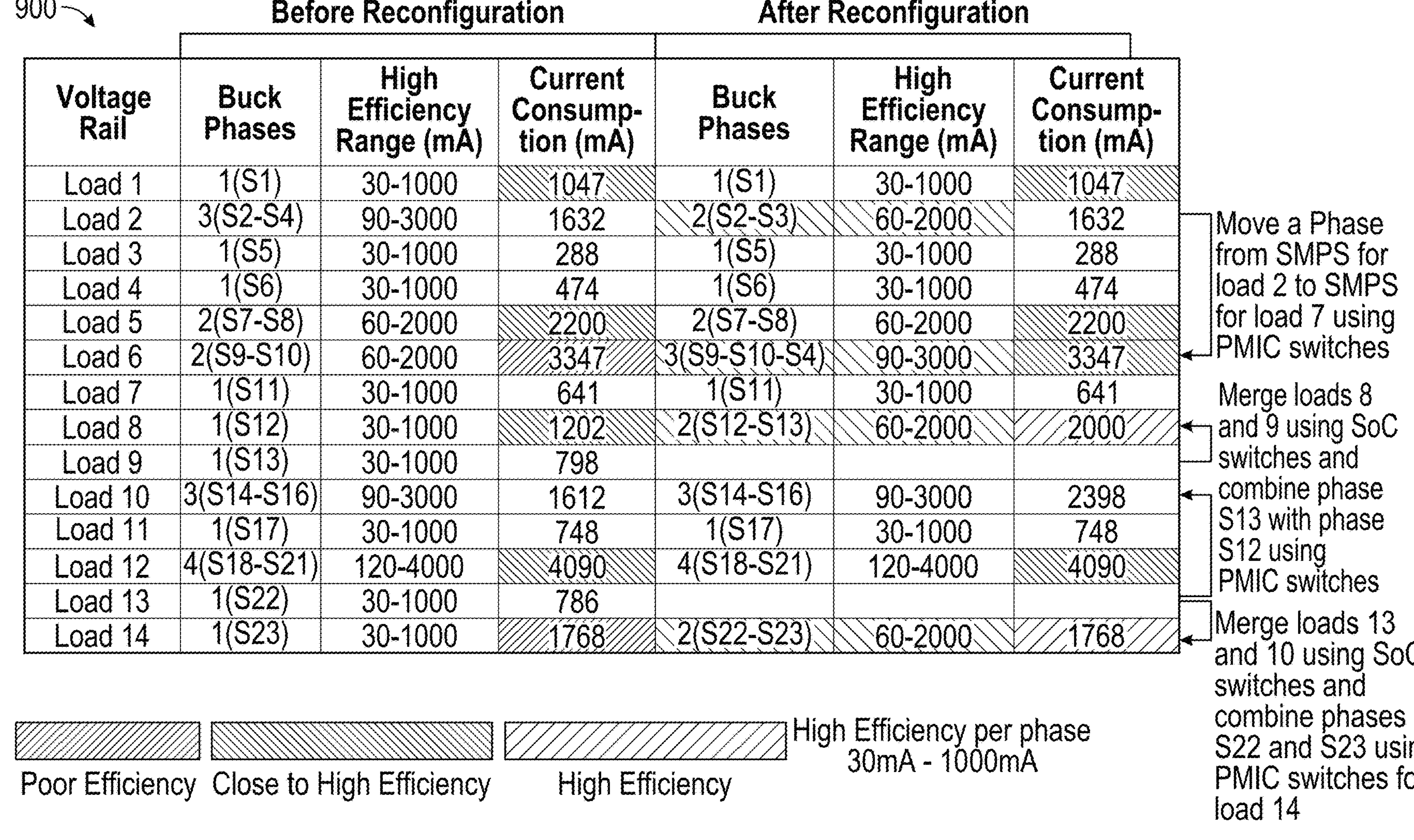
FIG. 9 is a table illustrating merging of loads and combining of SMPS phases, in accordance with certain aspects of the present disclosure.

FIG. 9 is a table 900 illustrating the merging of loads and combining (e.g., ganging) of SMPS phases, in accordance with certain aspects of the present disclosure. The SMPS for some loads may be operating with poor power efficiency (e.g., in an under-load or over-load operating region with low efficiency), the SMPS of some loads may be operating close to high power efficiency (e.g., within 100 mA of the high-efficiency operating region), and the SMPS of some loads may be operating in high power efficiency. For example, as described, the high-efficiency region may correspond to 30 mA to 1000 mA per phase. Therefore, for the SMPS of Load 5 with two phases (S7 and S8), the high-efficiency operating region may correspond to 60 mA to 2000 mA. However, Load 5 may consume 2200 mA, which is close to (e.g., within 100 mA per phase), but not within the high-efficiency region. As shown, loads may be merged, and SMPS phases may be combined to operate SMPSs with high power efficiency. For example, before any reconfiguration (e.g., merging of loads and combining of SMPS phases), the SMPS for Load 2 may operate with three phases with a high-efficiency region of 90 mA to 3000 mA, and the SMPS for Load 6 may operate with two phases with a high-efficiency region of 60 mA to 2000 mA. Load 2 may consume 1632 mA, and load 6 may consume 3347 mA. Therefore, the SMPS for Load 6 may be operating in an over-load operating region with low power efficiency. The PMIC switches (e.g., a power multiplexer in the PMIC) may be used to move one of the phases of the SMPS for Load 2 to the SMPS for Load 6. Thus, the SMPS for Load 2 may now operate with two phases with a high-efficiency region of 60 mA to 2000 mA, and the SMPS for Load 6 may now operate with three phases with a high-efficiency region of 90 mA to 3000 mA. As a result, the SMPS for Load 2 are now operating in the high-efficiency region and the SMPS for Load 6 is operating close to high efficiency.

As shown, Load 9 may be consuming 798 mA, and Load 8 may be consuming 1202 mA. Both Load 8 and Load 9 may be receiving power from respective single-phase SMPSs, and the SMPS for Load 8 may be in an over-load operating region. Thus, the SMPS phase S13 for Load 8 may be combined with the SMPS phase S12 using one or more PMIC switches. Moreover, one or more SoC switches (e.g., power multiplexer in the SoC) may be used to merge Loads 8 and 9 to consume current from the same SMPS (e.g., SMPS operating with combined phases S12 and S13). Loads 8 and 9 now consume a combined current of 2000 mA which is within the high-efficiency region (e.g., 60 mA to 2000 mA) of the dual-phase SMPS operating with phases S12 and S13.

As shown, Load 14 may be consuming 1768 mA from a single-phase SMPS including phase S23 before reconfiguration. Adding a phase for the SMPS of Load 14 would allow the SMPS for Load 14 to operate in the high-efficiency region. Therefore, Load 13 may be merged with Load 10 using one or more SoC switches, freeing up phase S22 previously used for Load 13 to be moved to the SMPS for Load 14, as shown. Thus, the SMPS for Load 14 may now operate with phases S22 and S23 with a high-efficiency region of 60 mA to 2000 mA. Since Load 14 is consuming 1768 mA, the SMPS for Load 14 operating with phases S22 and S23 operates in the high-efficiency region. The ML controller 802 may be trained to consider different scenarios, including scenarios described with respect to FIG. 9, and control PMIC and SoC multiplexers to merge/unmerge loads and/or gang/ungang phases in an attempt to increase the number of SMPSs that are operating in the high-efficiency region. In some aspects, to train the ML model for the controller 802, current measurements may be performed for each of various voltage rails associated with different loads and when operating in different modes or use cases. The current measurements, and in some cases, various operating conditions, may be provided to the ML model to train the ML model and generate a decision tree that indicates multiplexer configurations associated with respective modes and/or operating conditions described herein such as part type, supplied voltage to each load, temperature and frequency specifications, or current rating. Once trained, the ML model uses the decision tree to identify one or more multiple configurations to be applied based on a mode of operation and/or one or more operating conditions.

Example Power Generation Operations

Figure 10:
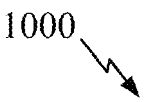
FIG. 10 is a flow diagram illustrating example operations for power generation, in accordance with certain aspects of the present disclosure.

FIG. 10 is a flow diagram illustrating example operations 1000 for power generation, in accordance with certain aspects of the present disclosure. The operations 1000 may be performed by a power distribution network such as the power distribution networks 400, 500, 550, 700, 800 as well as a controller such as the processor 104 of FIG. 1 or controller 802 of FIG. 8.

At block 1002, the power generation circuit may determine at least one multiplexer configuration of one or more multiplexers (e.g., one or more of multiplexers 502, 505, 507, 602, 702, 704) to direct current from at least one of a plurality of power supply phase circuits (e.g., SMPS phases such as phases S1-S23 described with respect to FIG. 9 or SMPS1-SMPS3 described with respect to FIGS. 5A and 6-8) to at least one of a plurality of voltage rails (e.g., voltage rails for various loads, such as memory, CPU, GPU, multimedia described herein). A first operating region (e.g., high-efficiency region shown in FIG. 3) of each of the plurality of power supply phase circuits may be identified based on a power efficiency of each of the plurality of power supply phase circuits. The at least one multiplexer configuration may be determined based on the first operating region. In some aspects, the at least one multiplexer configuration may be further determined based on an amount of current supplied by each of the plurality of power supply phase circuits. At block 1004, the power generation circuit may control the one or more multiplexers based on the at least one multiplexer configuration.

The first operating region of each of the plurality of power supply phase circuits may be associated with a power supply output current being more than a first current threshold (e.g., 30 mA per phase in the examples described herein and also referred to herein as the low load-current threshold) and less than a second current threshold (e.g., 1000 mA per phase in the examples described herein and also referred to herein as the high load-current threshold). A second operating region (e.g., an under-load operating region) of each of the plurality of power supply phase circuits is associated with the power supply output current being less than the first current threshold. A third operating region of each of the plurality of power supply phase circuits may be associated with the power supply output current being more than the second current threshold. The power efficiency of each of the plurality of power supply phase circuits may be greater when operating in the first operating region as compared to operating in the second operating region or the third operating region.

In some aspects, the one or more multiplexers may be controlled to combine (e.g., merge) at least two of the plurality of voltage rails to receive current from the same one or more power supply phase circuits of the plurality of power supply phase circuits. For example, the plurality of voltage rails may be associated with respective loads that are part of a SoC, such as the SoC shown in FIGS. 5A, 5B, and 6-8. The one or more multiplexers may be part of the SoC.

In some aspects, the one or more multiplexers are controlled to gang at least two of the plurality of power supply phase circuits to supply current for the same voltage rail of the plurality of voltage rails. The plurality of power supply phase circuits may be part of a PMIC, such as the PMIC shown in FIGS. 5A, 5B, and 6-8. The one or more multiplexers may be part of the PMIC.

In some aspects, the at least one multiplexer configuration may be determined via inferencing by an ML model (e.g., implemented via ML controller 802 of FIG. 8). The at least one multiplexer configuration may be determined via the ML controller based on one or more of: a current rating of at least one of the plurality of power supply phase circuits; an amount of current being supplied by at least one of the plurality of power supply phase circuits; current consumption associated with at least one of the plurality of voltage rails; a voltage associated with at least one of the plurality of voltage rails; a temperature of at least one of the plurality of power supply phase circuits; an operating frequency of at least one of the plurality of power supply phase circuits; a part type (e.g., process corner) of circuitry associated with each of the plurality of voltage rails; or a use case associated the circuitry (e.g., whether the circuitry is used for VR or AR). In some aspects, determining the at least one multiplexer configuration may include determining to merge at least two of the plurality of voltage rails to receive current from the same one or more power supply phase circuits of the plurality of power supply phase circuits or gang at least two of the power supply phase circuits to supply the same voltage rail of the plurality of voltage rails, based on a use case associated with an apparatus including the plurality of the voltage rails.

EXAMPLE ASPECTS

Aspect 1: An electronic device, comprising: a plurality of power supply phase circuits; a voltage rail; a first multiplexer coupled between at least one of the plurality of power supply phase circuits and the voltage rail; and a controller configured to: determine a multiplexer configuration of the first multiplexer to direct current from the at least one of the plurality of power supply phase circuits to the voltage rail, wherein a first operating region of each of the plurality of power supply phase circuits is identified based on a power characteristic of each of the plurality of power supply phase circuits, and wherein the controller is configured to identify the multiplexer configuration based on the first operating region; and control the first multiplexer based on the multiplexer configuration.

Aspect 2: The electronic device of Aspect 1, wherein the controller is configured to determine the multiplexer configuration based on an amount of current supplied by each of the plurality of power supply phase circuits.

Aspect 3: The electronic device of Aspect 1 or 2, wherein the first operating region of each of the plurality of power supply phase circuits is associated with a power supply output current being more than a first current threshold and less than a second current threshold.

Aspect 4: The electronic device of Aspect 3, wherein: a second operating region of each of the plurality of power supply phase circuits is associated with the power supply output current being less than the first current threshold; and a third operating region of each of the plurality of power supply phase circuits is associated with the power supply output current being more than the second current threshold.

Aspect 5: The electronic device of Aspect 4, wherein the power characteristic comprises a power efficiency, and wherein the power efficiency of each of the plurality of power supply phase circuits is greater when operating in the first operating region as compared to operating in the second operating region or the third operating region.

Aspect 6: The electronic device according to any of Aspects 1-5, wherein the voltage rail is one of a plurality of voltage rails, and wherein, to determine the multiplexer configuration, the controller is configured to determine, based on a mode associated with the electronic device, to at least one of: merge at least two of the plurality of voltage rails to receive current from the same one or more power supply phase circuits of the plurality of power supply phase circuits; or merging at least two of the power supply phase circuits to supply the same voltage rail of the plurality of voltage rails.

Aspect 7: The electronic device according to any of Aspects 1-6, wherein the voltage rail is one of a plurality of voltage rails, and wherein the controller is configured to control the first multiplexer to combine at least two of the plurality of voltage rails to receive current from the same one or more power supply phase circuits of the plurality of power supply phase circuits.

Aspect 8: The electronic device of Aspect 7, wherein the plurality of voltage rails are associated with respective loads that are part of a system on chip (SoC), and wherein the first multiplexer are part of the SoC.

Aspect 9: The electronic device of Aspect 8, wherein the first multiplexer is part of a core circuit of the SoC.

Aspect 10: The electronic device according to any of Aspects 1-9, wherein the controller is configured to control the first multiplexer to merge at least two of the plurality of power supply phase circuits to supply current for the voltage rail.

Aspect 11: The electronic device of Aspect 10, further comprising a power management integrated circuit (PMIC) including the plurality of power supply phase circuits, and wherein the first multiplexer is part of the PMIC.

Aspect 12: The electronic device according to any of Aspects 1-11, wherein the controller comprises a machine learning (ML) controller.

Aspect 13: The electronic device of Aspect 12, wherein the ML controller is configured to determine the multiplexer configuration based on one or more of: a current rating of at least one of the plurality of power supply phase circuits; an amount of current being supplied by at least one of the plurality of power supply phase circuits; current consumption associated with the voltage rail; a voltage associated with the voltage rail; a temperature of at least one of the plurality of power supply phase circuits; an operating frequency of at least one of the plurality of power supply phase circuits; a part type of a system on chip (SoC) associated with the voltage rail; or a mode associated with the SoC.

Aspect 14: The electronic device according to any of Aspects 1-13, wherein the first multiplexer includes inputs coupled to outputs of at least a first phase circuit and a second phase circuit of the plurality of power supply phase circuits and an output coupled to the voltage rail.

Aspect 15: The electronic device of Aspect 14, further comprising a second multiplexer includes a first input coupled to an output of the first multiplexer, a second input coupled to the output of the second phase circuit, and an output coupled to another voltage rail.

Aspect 16: The electronic device of Aspect 15, wherein the second multiplexer is configured to merge the voltage rail and another voltage rail to receive current from the same one or more phase circuits of the plurality of power supply phase circuits.

Aspect 17: The electronic device of Aspect 16, wherein the voltage rail and the other voltage rail are associated with respective loads that are part of a system on chip (SoC), and wherein the second multiplexer is part of the SoC.

Aspect 18: The electronic device according to any of Aspects 14-17, wherein the first multiplexer is configured to direct current from each of the first phase circuit and the second phase circuit to the voltage rail.

Aspect 19: The electronic device of Aspect 18, wherein the plurality of power supply phase circuits are part of a power management integrated circuit (PMIC), and wherein the first multiplexer is part of the PMIC.

Aspect 20: A method for power generation, comprising: determining at least one multiplexer configuration of one or more multiplexers to direct current from at least one of a plurality of power supply phase circuits to at least one of a plurality of voltage rails, wherein a first operating region of each of the plurality of power supply phase circuits is identified based on a power efficiency of each of the plurality of power supply phase circuits, and wherein the at least one multiplexer configuration is determined based on the first operating region; and controlling the one or more multiplexers based on the at least one multiplexer configuration.

Aspect 21: The method of Aspect 20, wherein the at least one multiplexer configuration is further determined based on an amount of current supplied by each of the plurality of power supply phase circuits.

Aspect 22: The method of Aspect 20 or 21, wherein the first operating region of each of the plurality of power supply phase circuits is associated with a power supply output current being more than a first current threshold and less than a second current threshold.

Aspect 23: The method of Aspect 22, wherein: a second operating region of each of the plurality of power supply phase circuits is associated with the power supply output current being less than the first current threshold; and a third operating region of each of the plurality of power supply phase circuits is associated with the power supply output current being more than the second current threshold.

Aspect 24: The method of Aspect 23, wherein the power efficiency of each of the plurality of power supply phase circuits is greater when operating in the first operating region as compared to operating in the second operating region or the third operating region.

Aspect 25: The method according to any of Aspects 20-24, wherein the one or more multiplexers are controlled to combine at least two of the plurality of voltage rails to receive current from the same one or more power supply phase circuits of the plurality of power supply phase circuits.

Aspect 26: The method of Aspect 25, wherein the plurality of voltage rails are associated with respective loads that are part of a system on chip (SoC), and wherein the one or more multiplexers are part of the SoC.

Aspect 27: The method of Aspect 26, wherein the one or more multiplexers are part of a core circuit of the SoC.

Aspect 28: The method according to any of Aspects 20-27, wherein the one or more multiplexers are controlled to merge at least two of the plurality of power supply phase circuits to supply current for the same voltage rail of the plurality of voltage rails.

Aspect 29: The method of Aspect 28, wherein the plurality of power supply phase circuits are part of a power management integrated circuit (PMIC), and wherein the one or more multiplexers are part of the PMIC.

Aspect 30: The method according to any of Aspects 20-29, wherein the at least one multiplexer configuration is determined via inferencing by a machine learning (ML) model.

Aspect 31: The method of Aspect 30, wherein the at least one multiplexer configuration is determined via the ML model based on one or more of: a current rating of at least one of the plurality of power supply phase circuits; an amount of current being supplied by at least one of the plurality of power supply phase circuits; current consumption associated with at least one of the plurality of voltage rails; a voltage associated with at least one of the plurality of voltage rails; a temperature of at least one of the plurality of power supply phase circuits; an operating frequency of at least one of the plurality of power supply phase circuits; a part type of a system on chip (SoC) associated with the plurality of voltage rails; or a mode associated the SoC.

Aspect 32: The method according to any of Aspects 20-31, wherein determining the at least one multiplexer configuration comprises determining to merge at least two of the plurality of voltage rails to receive current from the same one or more power supply phase circuits of the plurality of power supply phase circuits or to merge at least two of the power supply phase circuits to supply the same voltage rail of the plurality of voltage rails, based on a mode associated with an apparatus including the plurality of the voltage rails.

Aspect 33: A non-transitory computer-readable medium having instructions stored thereon, that when executed by one or more processors, cause the one or more processors to: determine at least one multiplexer configuration of one or more multiplexers to direct current from at least one of a plurality of power supply phase circuits to at least one of a plurality of voltage rails, wherein an operating region of each of the plurality of power supply phase circuits is identified based on a power efficiency of each of the plurality of power supply phase circuits, and wherein the at least one multiplexer configuration is determined based on the operating region; and control the one or more multiplexers based on the at least one multiplexer configuration.

Aspect 34: An electronic device, comprising: a plurality of power supply phase circuits; a plurality of voltage rails; and one or more multiplexers coupled between one or more of the plurality of power supply phase circuits and one or more of the plurality of voltage rails, the one or more multiplexers including at least one of: a first multiplexer having inputs coupled to outputs of at least a first phase circuit and a second phase circuit of the plurality of power supply phase circuits and an output coupled to a first voltage rail of the plurality of voltage rails; or a second multiplexer having a first input coupled to an output of the first multiplexer, a second input coupled to the output of the second phase circuit, and an output coupled to a second voltage rail of the plurality of voltage rails.

Aspect 35: The electronic device of Aspect 34, wherein the first multiplexer is configured to direct current from each of the first phase and the second phase to at least one of the plurality of voltage rails.

Aspect 36: The electronic device of Aspect 35, wherein the plurality of power supply phase circuits are part of a power management integrated circuit (PMIC), and wherein the first multiplexer is part of the PMIC.

Aspect 37: The electronic device according to any of Aspects 25-27, wherein the second multiplexer is configured to merge at least the first voltage rail and the second voltage rail to receive current from the same one or more phases of the plurality of power supply phase circuits.

Aspect 38: The electronic device of Aspect 37, wherein the plurality of voltage rails are associated with respective loads that are part of a system on chip (SoC), and wherein the second multiplexer is part of the SoC.

ADDITIONAL CONSIDERATIONS

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. An electronic device, comprising:

a plurality of power supply phase circuits;

a voltage rail;

a first multiplexer coupled between at least one of the plurality of power supply phase circuits and the voltage rail; and a controller configured to:

determine a multiplexer configuration of the first multiplexer to direct current from the at least one of the plurality of power supply phase circuits to the voltage rail, wherein a first operating region of each of the plurality of power supply phase circuits is identified based on a power efficiency characteristic of each of the plurality of power supply phase circuits, and wherein the controller is configured to identify the multiplexer configuration based on the first operating region; and control the first multiplexer based on the multiplexer configuration.

2. The electronic device of claim 1, wherein the controller is configured to determine the multiplexer configuration based on an amount of current supplied by each of the plurality of power supply phase circuits.

3. The electronic device of claim 1, wherein the first operating region of each of the plurality of power supply phase circuits is associated with a power supply output current being more than a first current threshold and less than a second current threshold.

4. The electronic device of claim 3, wherein:

a second operating region of each of the plurality of power supply phase circuits is associated with the power supply output current being less than the first current threshold; and a third operating region of each of the plurality of power supply phase circuits is associated with the power supply output current being more than the second current threshold.

5. The electronic device of claim 4, wherein the power efficiency characteristic comprises a power efficiency, and wherein the power efficiency of each of the plurality of power supply phase circuits is greater when operating in the first operating region as compared to operating in the second operating region or the third operating region.

6. The electronic device of claim 1, wherein the voltage rail is one of a plurality of voltage rails, and wherein, to determine the multiplexer configuration, the controller is configured to determine, based on a mode associated with the electronic device, to at least one of:

merge at least two of the plurality of voltage rails to receive current from the same one or more power supply phase circuits of the plurality of power supply phase circuits; or merging at least two of the power supply phase circuits to supply the same voltage rail of the plurality of voltage rails.

7. The electronic device of claim 1, wherein the voltage rail is one of a plurality of voltage rails, and wherein the controller is configured to control the first multiplexer to combine at least two of the plurality of voltage rails to receive current from the same one or more power supply phase circuits of the plurality of power supply phase circuits.

8. The electronic device of claim 7, wherein the plurality of voltage rails are associated with respective loads that are part of a system on chip (SoC), and wherein the first multiplexer are part of the SoC.

9. The electronic device of claim 8, wherein the first multiplexer is part of a core circuit of the SoC.

10. The electronic device of claim 1, wherein the controller is configured to control the first multiplexer to merge at least two of the plurality of power supply phase circuits to supply current for the voltage rail.

11. The electronic device of claim 10, further comprising a power management integrated circuit (PMIC) including the plurality of power supply phase circuits, and wherein the first multiplexer is part of the PMIC.

12. The electronic device of claim 1, wherein the controller comprises a machine learning (ML) controller.

13. The electronic device of claim 12, wherein the ML controller is configured to determine the multiplexer configuration based on one or more of:

a current rating of at least one of the plurality of power supply phase circuits;

an amount of current being supplied by at least one of the plurality of power supply phase circuits;

current consumption associated with the voltage rail;

a voltage associated with the voltage rail;

a temperature of at least one of the plurality of power supply phase circuits;

an operating frequency of at least one of the plurality of power supply phase circuits;

a part type of a system on chip (SoC) associated with the voltage rail; or a mode associated with the SoC.

14. The electronic device of claim 1, wherein the first multiplexer includes inputs coupled to outputs of at least a first phase circuit and a second phase circuit of the plurality of power supply phase circuits and an output coupled to the voltage rail.

15. The electronic device of claim 14, further comprising a second multiplexer includes a first input coupled to an output of the first multiplexer, a second input coupled to the output of the second phase circuit, and an output coupled to another voltage rail.

16. The electronic device of claim 15, wherein the second multiplexer is configured to merge the voltage rail and another voltage rail to receive current from the same one or more phase circuits of the plurality of power supply phase circuits.

17. The electronic device of claim 16, wherein the voltage rail and the other voltage rail are associated with respective loads that are part of a system on chip (SoC), and wherein the second multiplexer is part of the SoC.

18. The electronic device of claim 14, wherein the first multiplexer is configured to direct current from each of the first phase circuit and the second phase circuit to the voltage rail.

19. The electronic device of claim 18, wherein the plurality of power supply phase circuits are part of a power management integrated circuit (PMIC), and wherein the first multiplexer is part of the PMIC.

20. A method for power generation, comprising:

determining at least one multiplexer configuration of one or more multiplexers to direct current from at least one of a plurality of power supply phase circuits to at least one of a plurality of voltage rails, wherein a first operating region of each of the plurality of power supply phase circuits is identified based on a power efficiency of each of the plurality of power supply phase circuits, and wherein the at least one multiplexer configuration is determined based on the first operating region; and controlling the one or more multiplexers based on the at least one multiplexer configuration.

21. The method of claim 20, wherein the at least one multiplexer configuration is further determined based on an amount of current supplied by each of the plurality of power supply phase circuits.

22. The method of claim 20, wherein the first operating region of each of the plurality of power supply phase circuits is associated with a power supply output current being more than a first current threshold and less than a second current threshold.

23. The method of claim 22, wherein:

a second operating region of each of the plurality of power supply phase circuits is associated with the power supply output current being less than the first current threshold; and a third operating region of each of the plurality of power supply phase circuits is associated with the power supply output current being more than the second current threshold.

24. The method of claim 23, wherein the power efficiency of each of the plurality of power supply phase circuits is greater when operating in the first operating region as compared to operating in the second operating region or the third operating region.

25. The method of claim 20, wherein the one or more multiplexers are controlled to combine at least two of the plurality of voltage rails to receive current from the same one or more power supply phase circuits of the plurality of power supply phase circuits.

26. The method of claim 25, wherein the plurality of voltage rails are associated with respective loads that are part of a system on chip (SoC), and wherein the one or more multiplexers are part of the SoC.

27. The method of claim 26, wherein the one or more multiplexers are part of a core circuit of the SoC.

28. The method of claim 20, wherein the one or more multiplexers are controlled to merge at least two of the plurality of power supply phase circuits to supply current for the same voltage rail of the plurality of voltage rails.

29. The method of claim 28, wherein the plurality of power supply phase circuits are part of a power management integrated circuit (PMIC), and wherein the one or more multiplexers are part of the PMIC.

30. The method of claim 20, wherein the at least one multiplexer configuration is determined via inferencing by a machine learning (ML) model.

31. The method of claim 30, wherein the at least one multiplexer configuration is determined via the ML model based on one or more of:

a current rating of at least one of the plurality of power supply phase circuits;

an amount of current being supplied by at least one of the plurality of power supply phase circuits;

current consumption associated with at least one of the plurality of voltage rails;

a voltage associated with at least one of the plurality of voltage rails;

a temperature of at least one of the plurality of power supply phase circuits;

an operating frequency of at least one of the plurality of power supply phase circuits;4 a part type of a system on chip (SoC) associated with the plurality of voltage rails; or a mode associated the SoC.

32. The method of claim 20, wherein determining the at least one multiplexer configuration comprises determining to merge at least two of the plurality of voltage rails to receive current from the same one or more power supply phase circuits of the plurality of power supply phase circuits or to merge at least two of the power supply phase circuits to supply the same voltage rail of the plurality of voltage rails, based on a mode associated with an apparatus including the plurality of the voltage rails.

33. A non-transitory computer-readable medium having instructions stored thereon, that when executed by one or more processors, cause the one or more processors to:

determine at least one multiplexer configuration of one or more multiplexers to direct current from at least one of a plurality of power supply phase circuits to at least one of a plurality of voltage rails, wherein an operating region of each of the plurality of power supply phase circuits is identified based on a power efficiency of each of the plurality of power supply phase circuits, and wherein the at least one multiplexer configuration is determined based on the operating region; and control the one or more multiplexers based on the at least one multiplexer configuration.

* * * * *